(12) United States Patent
Lin et al.

(10) Patent No.: US 11,269,003 B2
(45) Date of Patent: Mar. 8, 2022

(54) SYSTEM AND METHOD FOR MONITORING SEMICONDUCTOR MANUFACTURING EQUIPMENT VIA ANALYSIS UNIT

(71) Applicant: NANYA TECHNOLOGY CORPORATION, New Taipei (TW)

(72) Inventors: Ching-Chih Lin, New Taipei (TW); Chun-Wei Wu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 81 days.

(21) Appl. No.: 16/787,473

(22) Filed: Feb. 11, 2020

(65) Prior Publication Data
US 2021/0247438 A1  Aug. 12, 2021

(51) Int. Cl.
*G01R 31/26* (2020.01)
*G08B 29/04* (2006.01)
(Continued)

(52) U.S. Cl.
CPC ......... *G01R 31/2642* (2013.01); *G01D 18/00* (2013.01); *G01R 31/2841* (2013.01); *G08B 29/04* (2013.01)

(58) Field of Classification Search
CPC ...... G05B 23/0221; G05B 2219/45031; G05B 23/00; G05B 23/021; G05B 23/0254; G05B 19/042; G05B 23/024; G05B 23/0264; G05B 23/0283; G05B 23/0297; G05B 23/0272; G05B 23/0289; G05B 19/4065; G05B 19/4183; G05B 19/4184; G05B 19/4185; G05B 2219/32287; G05B 2219/35001; G05B 2219/37254;
(Continued)

(56) References Cited

U.S. PATENT DOCUMENTS 5,406,502 A * 4/1995 Haramaty .......... G05B 19/4063
                                                    702/183
5,710,723 A * 1/1998 Hoth .................... G05B 23/024
                                                    702/181
(Continued)

FOREIGN PATENT DOCUMENTS

CN           1497181 A      5/2004
CN           1230869 C     12/2005

*Primary Examiner* — Vinh P Nguyen
(74) *Attorney, Agent, or Firm* — Muncy, Geissler, Olds & Lowe, P.C.

(57) ABSTRACT

The present disclosure provides a system and a method for monitoring semiconductor manufacturing equipment. The system includes a sensor, a circuit, and an analysis unit. The sensor provides a sensor signal. The circuit receives the sensor signal and generates an input signal. The analysis unit includes a signal management platform, receiving the input signal and performing a first data process to generate a first data signal; a diagnosis subsystem, receiving the first data signal from the signal management platform and performing a health status monitoring process to generate a second data signal; and a decision subsystem, performing a determination process to generate a third data signal according to the second data signal from the diagnosis subsystem. The diagnosis subsystem generates a feedback signal according to the third data signal, and the signal management platform transmits the feedback signal to the semiconductor manufacturing equipment.

13 Claims, 11 Drawing Sheets

(51) Int. Cl.
*G01R 31/28* (2006.01)
*G01D 18/00* (2006.01)

(58) Field of Classification Search
CPC .......... G05B 2219/37351; G05B 2219/37434; G05B 2219/37537; G05B 23/0235; G05B 23/0294; G05B 23/0235; G06N 3/0445; F04D 19/04; F04D 27/001; F04D 27/004; F04D 27/001; G01N 33/0011; G01N 33/0073; H01L 21/67253; H01L 21/6719; H01L 21/67276; G06F 13/10
See application file for complete search history.

(56) References Cited

U.S. PATENT DOCUMENTS

| | | | |
|---|---|---|---|
| 6,195,621 B1 * | 2/2001 | Bottomfield | G01H 1/003 |
| | | | 702/183 |
| 6,226,597 B1 * | 5/2001 | Eastman | G06Q 10/20 |
| | | | 702/34 |
| 6,351,723 B1 * | 2/2002 | Maekawa | G05B 23/0221 |
| | | | 702/185 |
| 6,937,963 B2 * | 8/2005 | Ishii | G05B 23/0291 |
| | | | 702/185 |
| 7,457,785 B1 * | 11/2008 | Greitzer | G01D 1/18 |
| | | | 706/12 |
| 7,597,318 B2 * | 10/2009 | Moriwaki | B65H 15/012 |
| | | | 271/185 |
| 7,713,760 B2 * | 5/2010 | Yue | H01L 21/67253 |
| | | | 438/14 |
| 9,292,473 B2 * | 3/2016 | Ba | G06F 17/00 |
| 9,972,517 B2 * | 5/2018 | Miki | G05B 23/0235 |
| 2005/0081605 A1 | 4/2005 | Chin | |

* cited by examiner

SYSTEM AND METHOD FOR MONITORING SEMICONDUCTOR MANUFACTURING EQUIPMENT VIA ANALYSIS UNIT

TECHNICAL FIELD

The present disclosure relates to a system and method for monitoring an equipment, and more particularly, to a system and a method for monitoring a semiconductor manufacturing equipment.

DISCUSSION OF THE BACKGROUND

Much of the rapid growth that has been experienced in the semiconductor industry is due to improvements in integration density. Semiconductor manufacturing equipment, such as vacuum pumps, are often necessary to provide a vacuum state for complex processing steps in order to achieve the improved integration density. Maintenance of the vacuum pumps is important because the pumps contain many high-speed moving parts prone to failure. Oftentimes the vacuum pumps are maintained by vendors without providing advance health indicators, and so operators must expend valuable resources to anticipate when malfunctions might occur. Since unexpected malfunctions of the vacuum pumps can cause defective products as well as health hazards to operators or maintenance personnel when flammable gasses are not properly exhausted, systems and methods for monitoring the overall condition of the vacuum pumps and providing advance indicators need to be effective and optimized.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a system for monitoring semiconductor manufacturing equipment, wherein the system includes a sensor, a circuit, and an analysis unit. The sensor provides at least one sensor signal representative of the semiconductor manufacturing equipment. The circuit receives the at least one sensor signal and generates at least one input signal. The analysis unit includes a signal management platform, receiving the at least one input signal and performing a first data process to generate a first data signal; a diagnosis subsystem, receiving the first data signal from the signal management platform, wherein the diagnosis subsystem performs a health status monitoring process to generate a second data signal; and a decision subsystem, performing a determination process to generate a third data signal according to the second data signal from the diagnosis subsystem, wherein the diagnosis subsystem generates a feedback signal according to the third data signal, and the signal management platform transmits the feedback signal to the semiconductor manufacturing equipment.

In some embodiments, the analysis unit further includes an alert message subsystem generating an alert signal according to the third data signal from the decision subsystem.

In some embodiments, the alert signal comprises a malfunction diagnosis alert, an equipment lifetime prediction alert, and a leakage/odor alert generated according to the third data signal, wherein the equipment lifetime prediction alert comprises an index score calculated according to the third data signal, and the alert signal is sent to a user of the semiconductor manufacturing equipment.

In some embodiments, the determination process performed by the decision subsystem compares the second data signal to a database of component values of the semiconductor manufacturing equipment, and the third data signal is generated according to whether a threshold level is reached in the comparison between the second data signal and the database of component values.

In some embodiments, when the feedback signal is indicative of a malfunction, the semiconductor manufacturing equipment is shut down.

In some embodiments, when the feedback signal is indicative of a normal equipment status, the semiconductor manufacturing equipment continues to operate without an interruption.

In some embodiments, the semiconductor manufacturing equipment includes one or more vacuum pumps.

Another aspect of the present disclosure provides a system for monitoring semiconductor manufacturing equipment, wherein the system includes a sensor, a circuit, one or more processors, and one or more computer-readable non-transitory storage media. The sensor provides at least one sensor signal representative of the semiconductor manufacturing equipment. The circuit receives the at least one sensor signal and generates at least one input signal. The one or more computer-readable non-transitory storage media are coupled to the one or more processors and include instructions operable when executed by the one or more processors to cause the system to: receive the at least one input signal and perform a first data process to generate a first data signal; receive the first data signal and perform a health status monitoring process to generate a second data signal; and perform a determination process to generate a third data signal according to the second data signal, wherein a feedback signal is generated according to the third data signal, and the feedback signal is transmitted to the semiconductor manufacturing equipment.

In some embodiments, the one or more computer-readable non-transitory storage media further include instructions operable when executed by the one or more processors to cause the system to generate an alert signal according to the third data signal.

In some embodiments, wherein the alert signal comprises a malfunction diagnosis alert, an equipment lifetime prediction alert, and a leakage/odor alert generated according to the third data signal, the equipment lifetime prediction alert comprises an index score calculated according to the third data signal, and the alert signal is sent to a user of the semiconductor manufacturing equipment.

In some embodiments, the determination process compares the second data signal to a database of component values of the semiconductor manufacturing equipment, and the third data signal is generated according to whether a threshold level is reached in the comparison between the second data signal and the database of component values.

In some embodiments, when the feedback signal is indicative of a malfunction, the semiconductor manufacturing equipment is shut down.

In some embodiments, when the feedback signal is indicative of a normal equipment status, the semiconductor manufacturing equipment continues to operate without an interruption.

In some embodiments, the semiconductor manufacturing equipment includes one or more vacuum pumps.

Another aspect of the present disclosure provides a method for monitoring semiconductor manufacturing equipment including: providing, by a sensor, at least one sensor signal representative of the semiconductor manufacturing equipment; receiving, by a circuit, the at least one sensor signal generated by the sensor and generating at least one input signal; receiving, by a signal management platform, the at least one input signal and performing a first data process to generate a first data signal; receiving, by a diagnosis subsystem, the first data signal from the signal management platform and performing a health status monitoring process to generate a second data signal; and performing, by a decision subsystem, a determination process to generate a third data signal according to the second data signal from the diagnosis subsystem, wherein a feedback signal is generated by the diagnosis subsystem according to the third data signal, and the feedback signal is transmitted by the signal management platform to the semiconductor manufacturing equipment.

In some embodiments, the method further includes generating, by an alert message subsystem, an alert signal according to the third data signal from the decision subsystem.

In some embodiments, the step of generating the alert signal includes: generating a malfunction diagnosis alert, an equipment lifetime prediction alert, and a leakage/odor alert according to the third data signal, wherein the equipment lifetime prediction alert comprises an index score calculated according to the third data signal; and sending the alert signal to a user of the semiconductor manufacturing equipment.

In some embodiments, the step of performing the determination process to generate the third data signal includes: comparing the second data signal to a database of component values of the semiconductor manufacturing equipment; and generating the third data signal according to whether a threshold level is reached in the comparison between the second data signal and the database of component values.

In some embodiments, when the feedback signal is indicative of a malfunction, the semiconductor manufacturing equipment is shut down, and when the feedback signal is indicative of a normal equipment status, the semiconductor manufacturing equipment continues to operate without an interruption.

In some embodiments, the semiconductor manufacturing equipment comprises one or more vacuum pumps.

Accordingly, the systems and the methods for monitoring the semiconductor manufacturing equipment provide advance indicators capable of predicting the overall condition of equipment such as vacuum pumps. Due to the analysis unit, which includes an intelligent signal management platform and an alert message subsystem, operators of the semiconductor manufacturing equipment can monitor the status of the equipment and receive advance warnings before equipment malfunctions. Moreover, appropriate amounts of maintenance to be conducted can be determined based on the data provided by the monitoring systems and methods, thereby saving precious maintenance resources, preventing health hazards, and minimizing defective products.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
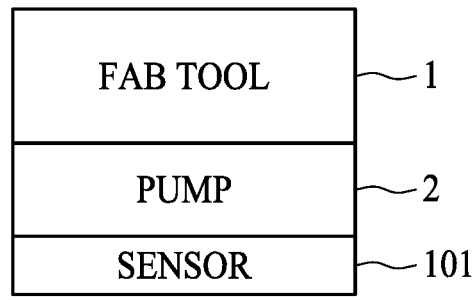
FIG. 1 is a schematic view of a semiconductor fabrication tool and a semiconductor manufacturing equipment according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic view of a semiconductor fabrication tool 1 and a semiconductor manufacturing equipment 2 according to some embodiments of the present disclosure. With reference to FIG. 1, the semiconductor fabrication tool 1 may include one or more chambers in which semiconductor manufacturing processes are conducted while the chambers are maintained in a vacuum state. The semiconductor manufacturing equipment 2 may be used to achieve the vacuum state, and the semiconductor manufacturing equipment 2 may include one or more vacuum pumps, for example. In some embodiments, the vacuum pumps of the semiconductor manufacturing equipment 2 may include positive displacement type pumps, momentum transfer type pumps, regenerative type pumps, a combination of the aforementioned types, or other suitable types of vacuum pumps arranged in a suitable configuration for the particular application of the semiconductor fabrication tool 1. The vacuum pumps of the semiconductor manufacturing equipment 2 may contain many high-speed moving parts and may cause unexpected processing equipment down time. Moreover, the failure of the vacuum pumps during semiconductor processing may result in the scrapping of defective products. In some embodiments, a sensor 101, which may also be an array of sensors, is coupled to the semiconductor manufacturing equipment 2 to capture a plurality of component sensor signals of the vacuum pumps. The component sensor signals captured by the sensor 101 may include sensor signals related to vibration, pressure, humidity, electric field, magnetic field, gases, odor, temperature, operating time, as well as other pertinent information helpful to diagnose or monitor the health of the semiconductor manufacturing equipment 2. The sensor 101 may be, for example, a transducer such as an accelerometer mounted to the vacuum pumps of the semiconductor manufacturing equipment 2 to convert vibration or motion along an axis of concern into an electrical signal, or a gas sensor that converts a response to an odorant to an electrical signal that can be analyzed. The sensor 101 may be mounted to the vacuum pumps of the semiconductor manufacturing equipment 2 by adhesive bond, tape, magnet, mechanical clasp, or other suitable bonding means.

Figure 2:
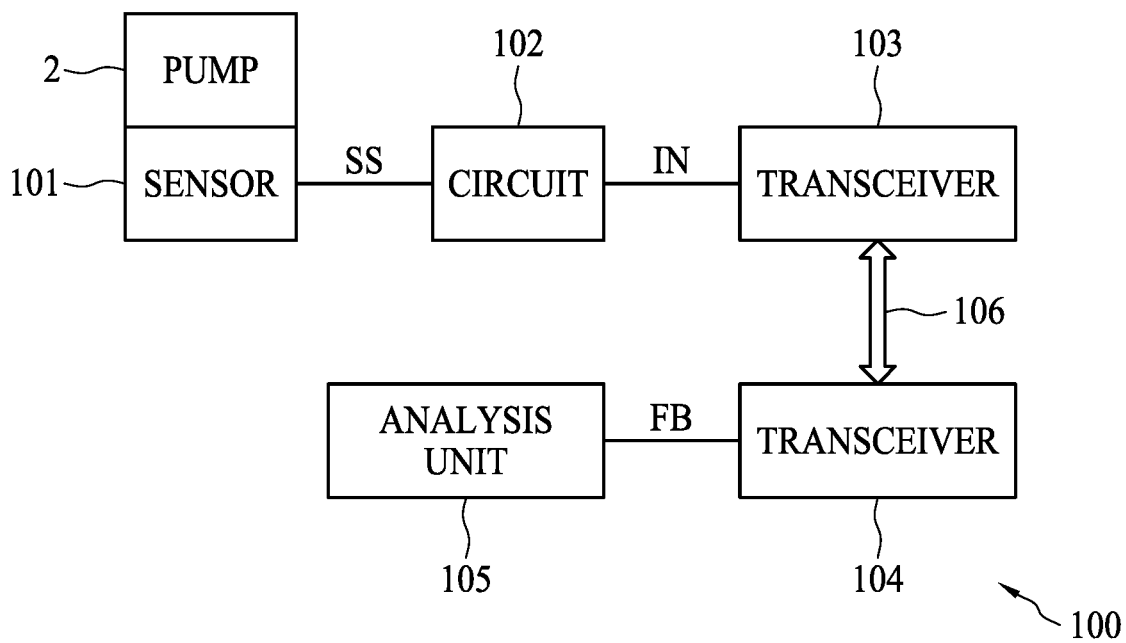
FIG. 2 is a block diagram of a system for monitoring a semiconductor manufacturing equipment according to some embodiments of the present disclosure.

FIG. 2 is a block diagram of a system 100 for monitoring the semiconductor manufacturing equipment 2 according to some embodiments of the present disclosure. With reference to FIG. 2, the system 100 for monitoring the semiconductor manufacturing equipment 2 includes a sensor 101, a circuit 102, a first transceiver 103, a second transceiver 104, and an analysis unit 105. In some embodiments, the sensor 101 provides at least one sensor signal SS representative of the semiconductor manufacturing equipment 2. The circuit 102 receives the at least one sensor signal SS from the sensor 101 and generates at least one input signal IN. The at least one input signal IN may be transmitted by the first transceiver 103 to the second transceiver 104 through a network link 106. In some embodiments, the at least one input signal IN may be modulated when it is transmitted by the first transceiver 103 and demodulated when it is received by the second transceiver 104. The network link 106 may be any suitable type of network link based on wired or wireless technology known in the art, including but not limited to radio, optical, or infrared communication means. In some embodiments, the analysis unit 105 receives the at least one input signal and performs a health analysis of the semiconductor manufacturing equipment 2 to generate a feedback signal FB. The feedback signal FB from the analysis unit 105 is transmitted to the semiconductor manufacturing equipment 2 through the network link 106 between the second transceiver 104 and the first transceiver 103. In some embodiments, the feedback signal FB may be modulated when it is transmitted by the second transceiver 104 and demodulated when it is received by the first transceiver 103. In some embodiments, when the feedback signal FB is transmitted to the semiconductor manufacturing equipment 2 and the feedback signal FB indicates a malfunction, the semiconductor manufacturing equipment 2 is shut down. For instance, a malfunction of the vacuum pumps of the semiconductor manufacturing equipment 2 may be detected by the analysis unit 105, and the malfunctioning vacuum pump is shut down according to the feedback signal FB. On the other hand, when the feedback signal FB indicates a normal equipment status, the semiconductor manufacturing equipment 2 may be allowed to continue to operate without an interruption.

Figure 3:
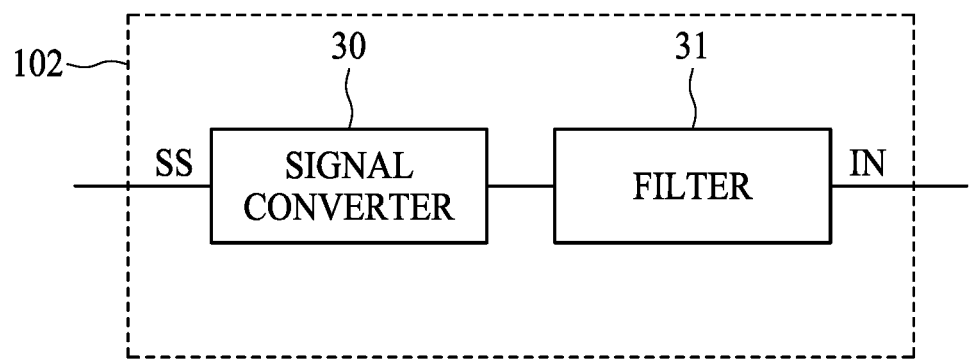
FIG. 3 is a block diagram of a circuit of a system for monitoring a semiconductor manufacturing equipment according to some embodiments of the present disclosure.

FIG. 3 is a block diagram of the circuit 102 of the system 100 for monitoring the semiconductor manufacturing equipment 2 according to some embodiments of the present disclosure. With reference to FIG. 3, the circuit 102 includes one or more signal converters 30 and one or more filters 31. In some embodiments, the signal converters 30 may include analog-to-digital (A/D) converters, digital-to-analog (D/A) converters, or other suitable signal converters. When generating the input signal IN for the analysis unit 105, the signal converters 30 of the circuit 102 may convert the sensor signal SS from an analog signal to a digital signal, for example. The filters 31 may include anti-alias filters, low-pass filters, high-pass filters, band-pass filters, or other suitable filters for the particular application of the system 100 for monitoring the semiconductor manufacturing equipment 2. The filters 31 may be used to improve the signal to noise ratio of the input signal IN, for instance. In some embodiments, the feedback signal FB may be converted by the signal converters 30 into a compatible format and filtered by the filters 31 before being transmitted to the semiconductor manufacturing equipment 2.

Figure 4:
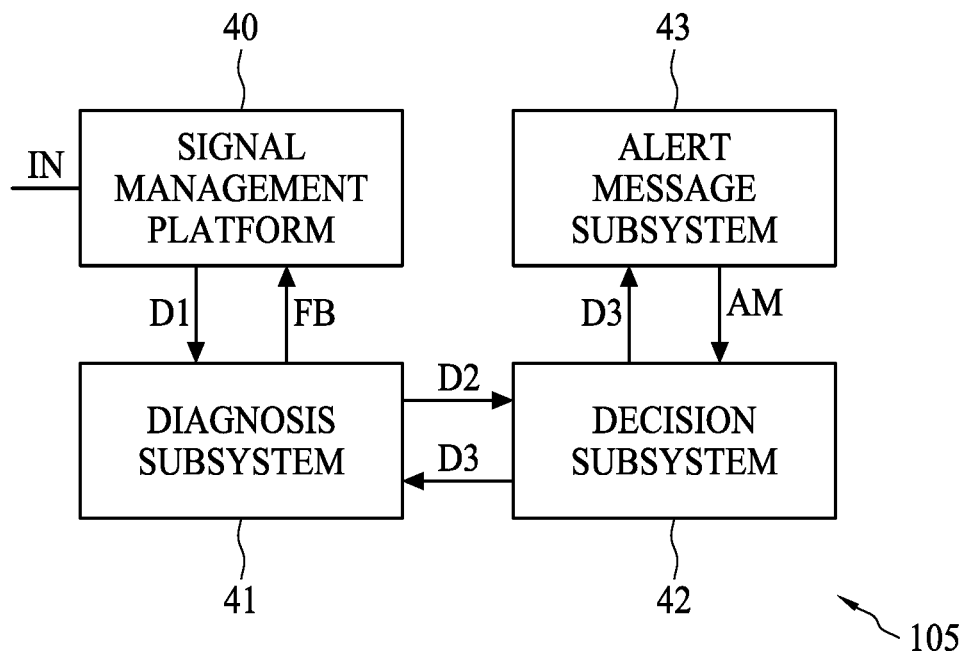
FIG. 4 is a block diagram of an analysis unit of a system for monitoring a semiconductor manufacturing equipment according to some embodiments of the present disclosure.

FIG. 4 is a block diagram of the analysis unit 102 of the system 100 for monitoring the semiconductor manufacturing equipment 2 according to some embodiments of the present disclosure. With reference to FIG. 4, the analysis unit 102 includes a signal management platform 40, a diagnosis subsystem 41, a decision subsystem 42, and an alert message subsystem 43. In some embodiments, the signal management platform 40 receives the at least one input signal IN and performs a first data process to generate a first data signal D1. The first data process performed by the signal management platform 40 may extract the sensor information contained in the input signal IN and package the sensor information into the first data signal D1. The diagnosis subsystem 41 receives the first data signal D1 from the signal management platform 40, and the diagnosis subsystem 41 performs a health status monitoring process to generate a second data signal D2. The health status monitoring process performed by the diagnosis subsystem 41 may determine the health status of the semiconductor manufacturing equipment 2 based on the sensor information contained in the first data signal D1. The decision subsystem 42 performs a determination process to generate a third data signal D3 according to the second data signal D2 from the diagnosis subsystem 41. The diagnosis subsystem 41 generates the feedback signal FB according to the third data signal D3, and the signal management platform 40 transmits the feedback signal FB to the semiconductor manufacturing equipment 2. As shown in FIG. 2, the feedback signal FB may be transmitted to the semiconductor manufacturing equipment 2 through the network link 106 established between the first transceiver 103 and the second transceiver 104.

Figure 5:
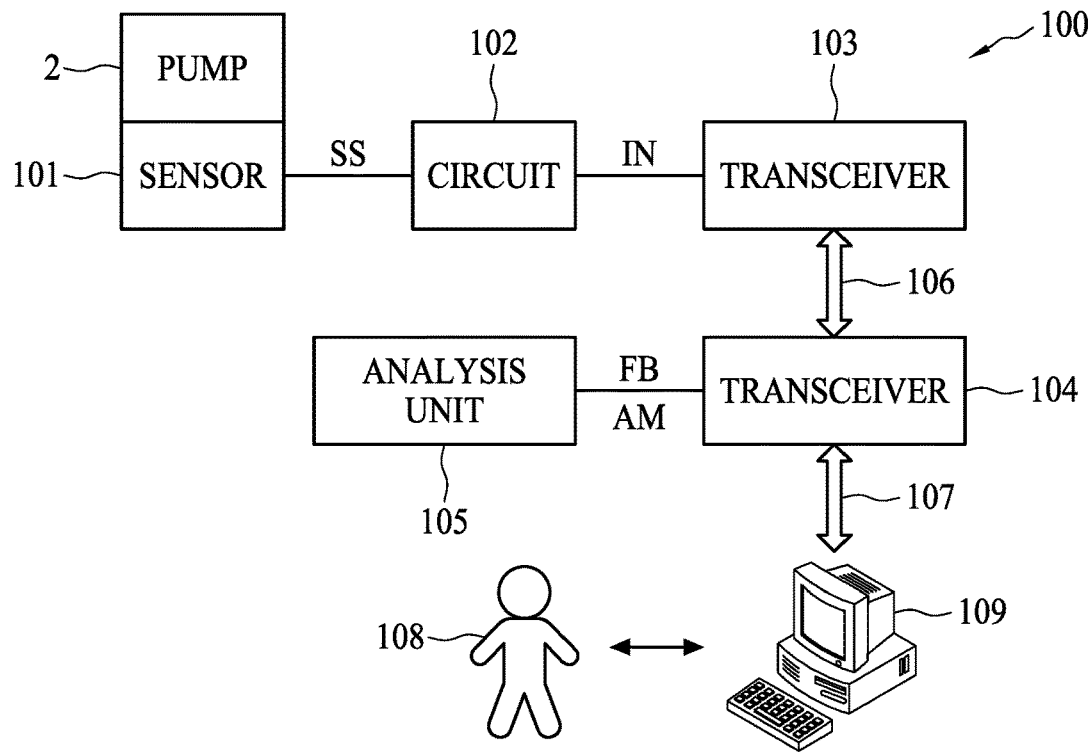
FIG. 5 is a block diagram depicting a user of a system for monitoring a semiconductor manufacturing equipment according to some embodiments of the present disclosure.
Figure 6:
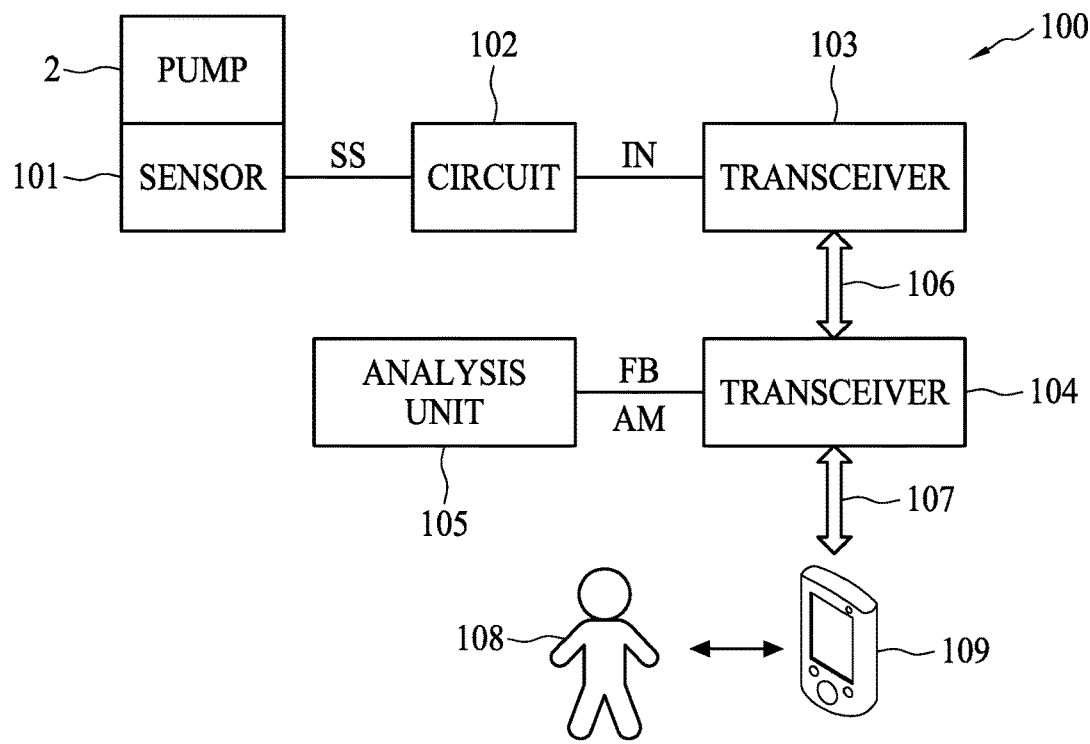
FIG. 6 is a block diagram depicting a user of a system for monitoring a semiconductor manufacturing equipment according to some embodiments of the present disclosure.
Figure 7:
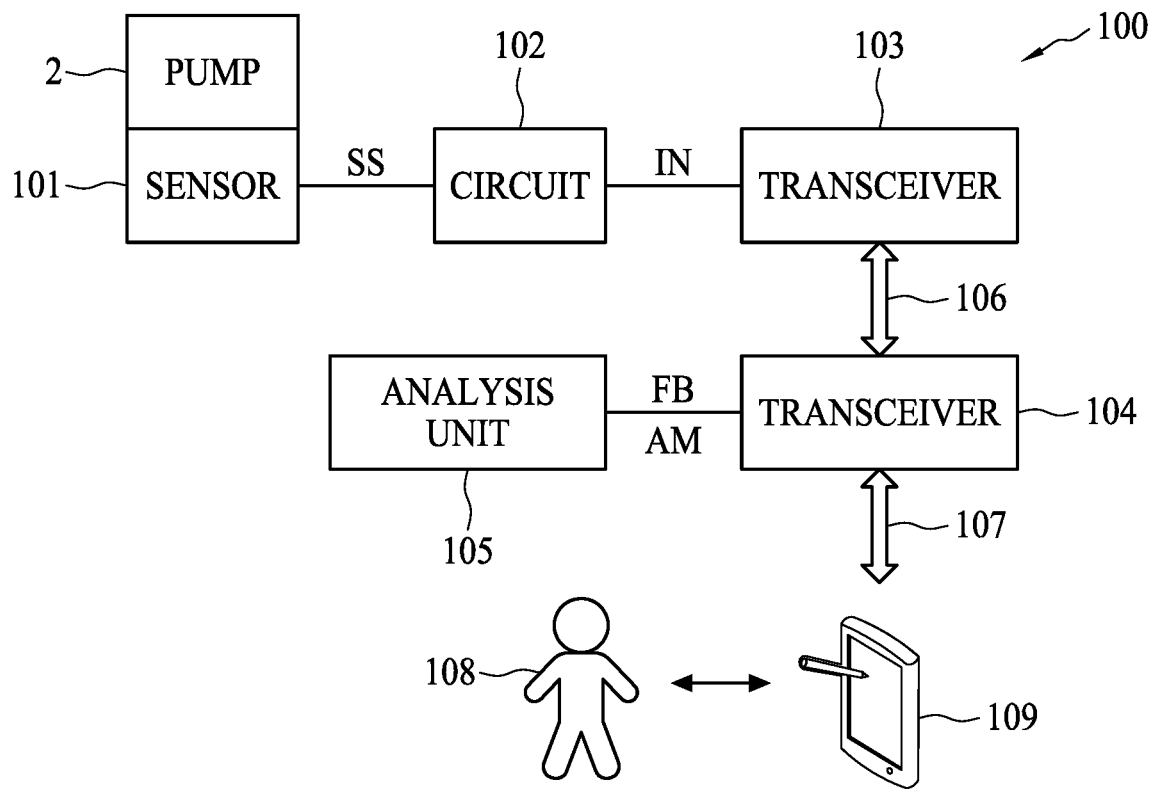
FIG. 7 is a block diagram depicting a user of a system for monitoring a semiconductor manufacturing equipment according to some embodiments of the present disclosure.
Figure 8:
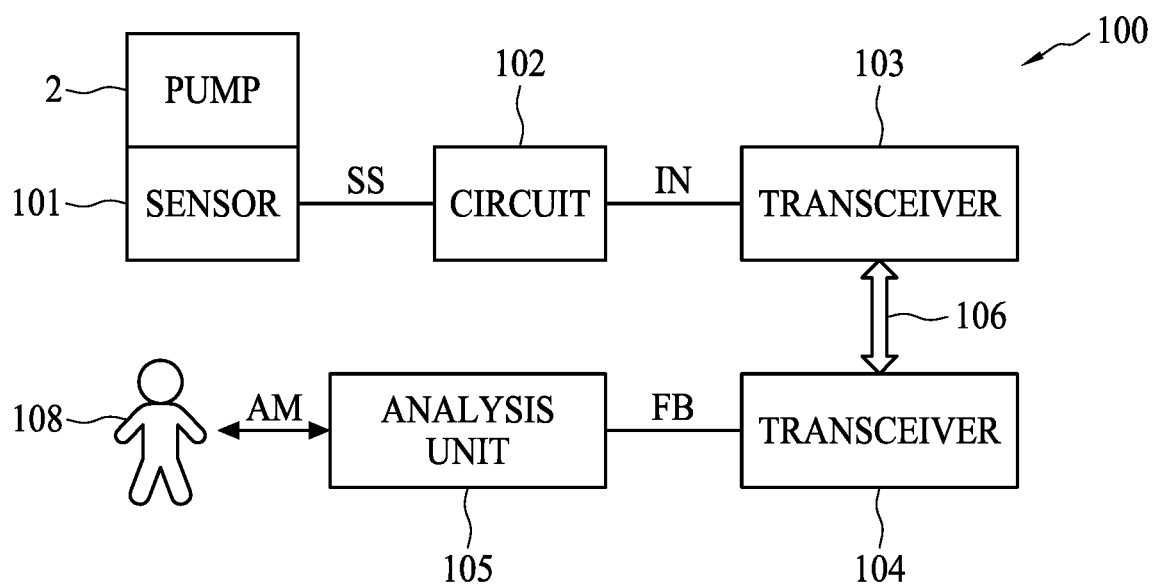
FIG. 8 is a block diagram depicting a user of a system for monitoring a semiconductor manufacturing equipment according to some embodiments of the present disclosure.

In some embodiments, the alert message subsystem 43 generates an alert signal AM according to the third data signal D3 from the decision subsystem 42. In some embodiments, the alert signal AM may be sent to a user of the semiconductor manufacturing equipment 2. FIG. 5 to FIG. 8 are block diagrams depicting a user 108 of the system 100 for monitoring the semiconductor manufacturing equipment 2 according to some embodiments of the present disclosure. With reference to FIG. 4 to FIG. 8, in some embodiments, the alert signal AM may be transmitted to the signal management platform 40 of FIG. 4. The signal management platform 40 may transmit the alert signal AM to the user 108 through a network link 107 established between the second transceiver 104 and a client system 109. As shown in FIG. 5 to FIG. 7, the client system 109 may be, for example, a desktop computer, a notebook computer, a smart phone, a tablet computer, or the like capable of displaying the alert signal AM to the user 108. The network link 107 may be any suitable type of network link based on wired or wireless technology known in the art, including but not limited to radio, optical, or infrared communication means. The network links 106 and 107 may be part of a same network or different networks. The network links 106 and 107 may be part of an intranet, an extranet, an ad hoc network, a virtual private network (VPN), a local area network (LAN), a wireless LAN (WLAN), a wireless WAN (WWAN), a wide area network (WAN), a metropolitan area network (MAN), a portion of the Internet, a portion of the Public Switched Telephone Network (PSTN), a cellular telephone network, or a combination of two or more of these. In some embodiments, as shown in FIG. 8, the alert signal AM may also be directly supplied and displayed by the analysis unit 102 to the user 108.

Figure 9:
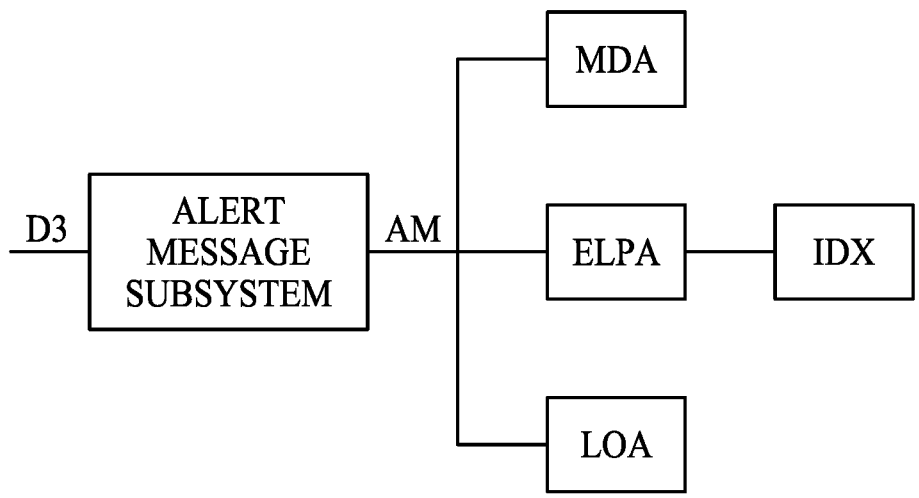
FIG. 9 is a relational diagram illustrating a relationship between a data signal and components of an alert signal according to some embodiments of the present disclosure.
Figure 10:
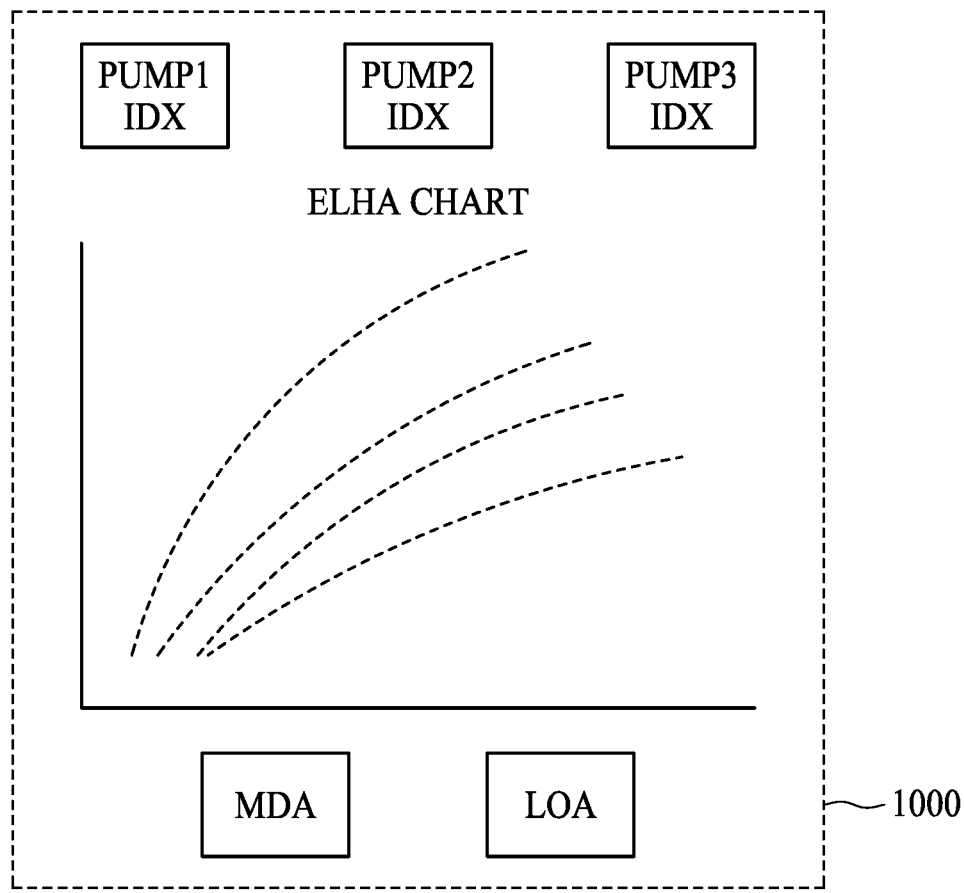
FIG. 10 is a graphical representation of an alert signal according to some embodiments of the present disclosure.
Figure 11:
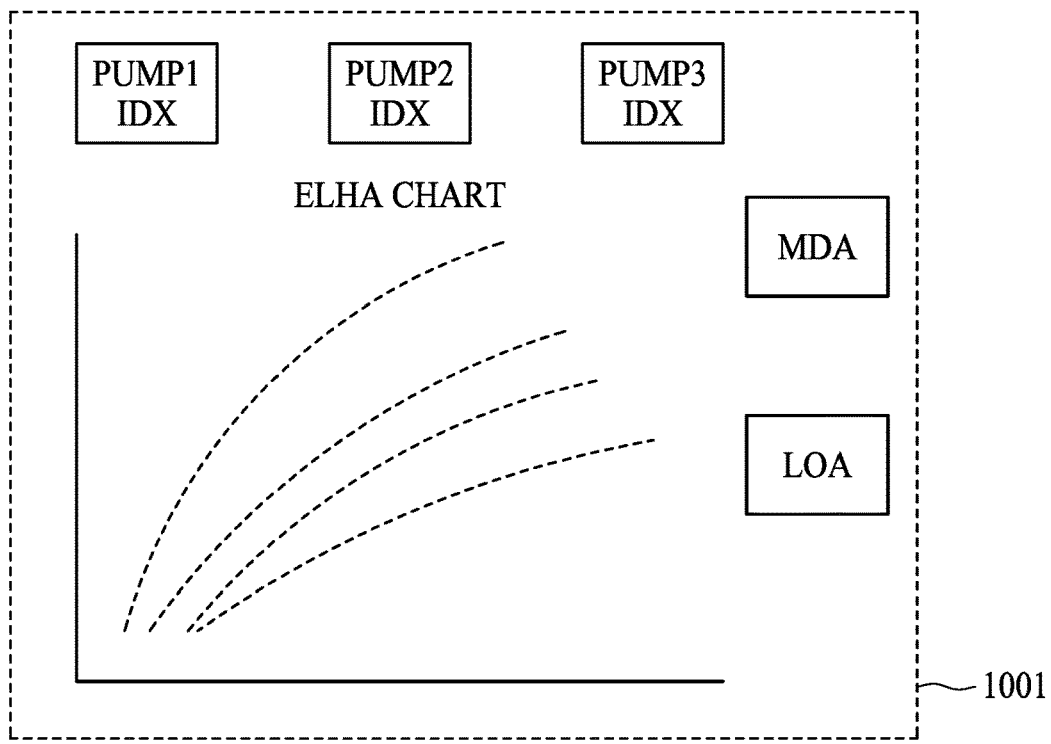
FIG. 11 is a graphical representation of an alert signal according to some embodiments of the present disclosure.
Figure 12:
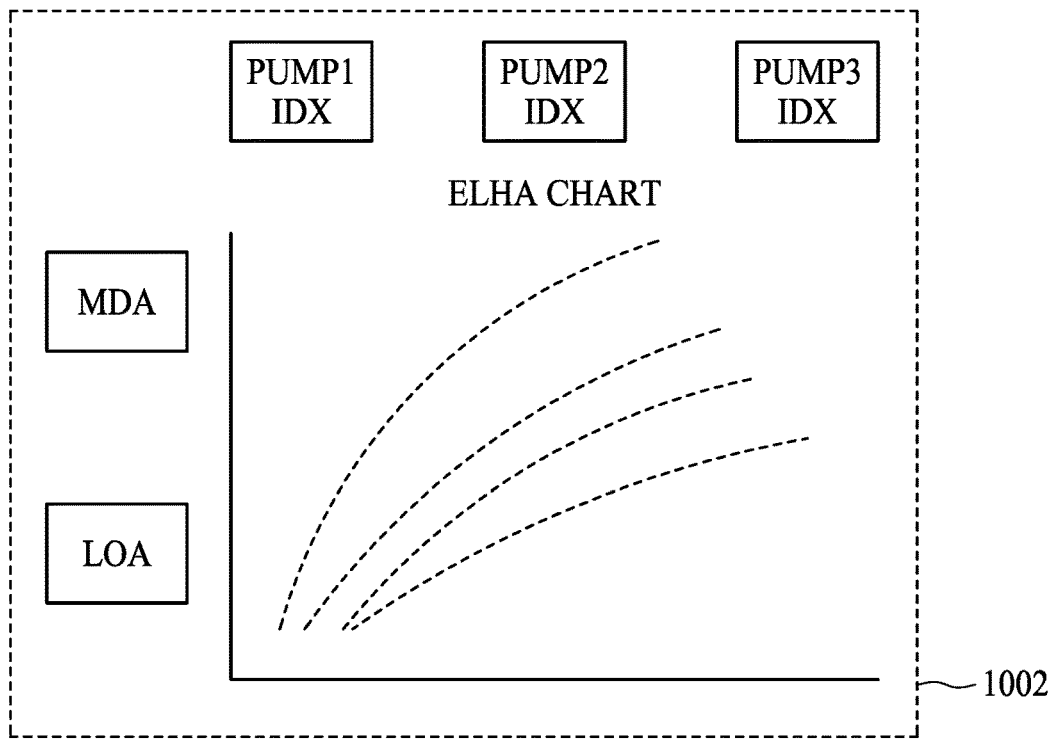
FIG. 12 is a graphical representation of an alert signal according to some embodiments of the present disclosure.

FIG. 9 is a relational diagram showing a relationship between the third data signal D3 and the components of the alert signal AM according to some embodiments of the present disclosure. With reference to FIG. 9, the alert signal AM generated by the alert message subsystem 43 according to the third data signal D3 may include a malfunction diagnosis alert MDA, an equipment lifetime prediction alert ELPA, and a leakage/odor alert LOA. Moreover, the equipment lifetime prediction alert ELPA may also include an index score IDX calculated according to the third data signal D3. It should be noted that, in some embodiments, the alert signal AM may also include other types of alerts detected by the diagnosis subsystem 41 that may be of interest to the user 108. FIG. 10 to FIG. 12 depict graphical representations 1000 to 1002 of the alert signal AM according to some embodiments of the present disclosure. With reference to FIG. 10 to FIG. 12, the index score IDX of the equipment lifetime prediction alert ELPA may be presented on a top row of the graphical representations, while data from the equipment lifetime prediction alert ELPA may be charted in the middle. The malfunction diagnosis alert MDA and the leakage/odor alert LOA may be presented on the sides of the ELPA chart, or at the bottom of the ELPA chart. It should be noted that other arrangements of the alert signal AM may be possible, and the graphical representations 1000 to 1002 serve merely as illustrative examples and should not be construed as limiting the present disclosure.

Figure 13:
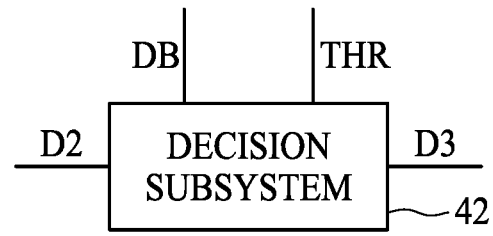
FIG. 13 is a relational diagram showing relationship between data signals, a database of component values, and a decision subsystem according to some embodiments of the present disclosure.
Figure 14:
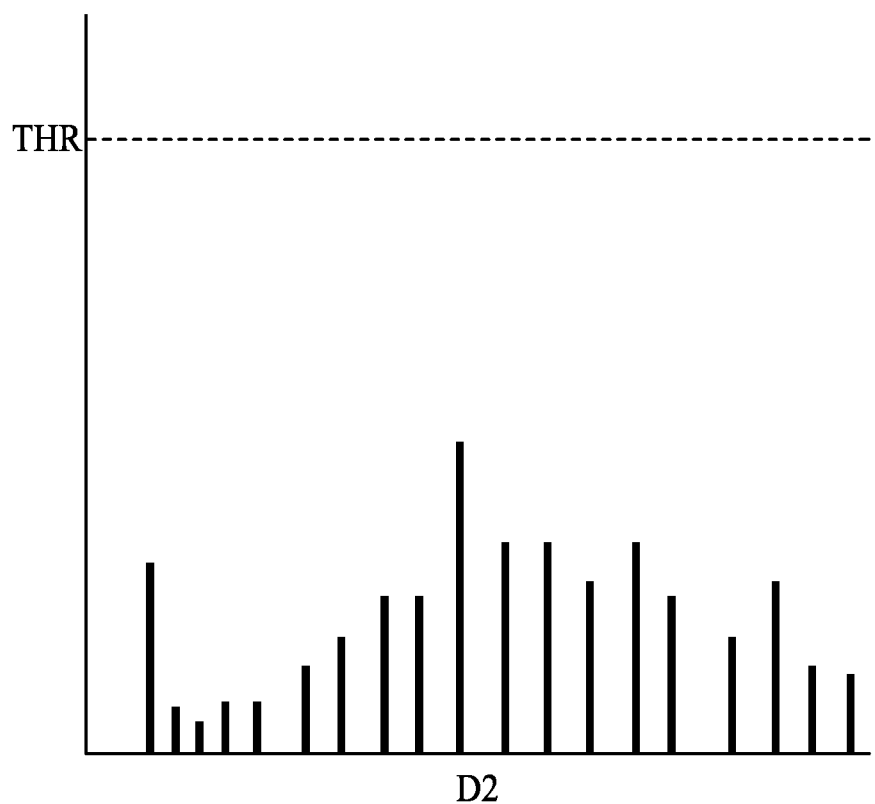
FIG. 14 is a relational chart of a data signal and a threshold level according to some embodiments of the present disclosure.
Figure 15:
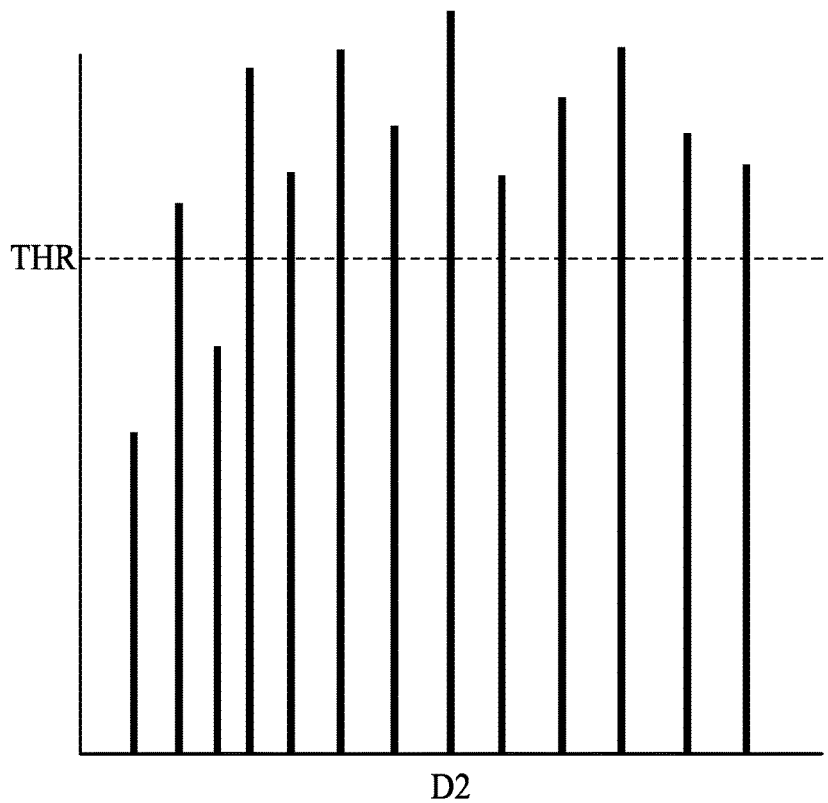
FIG. 15 is a relational chart of a data signal and a threshold level according to some embodiments of the present disclosure.

FIG. 13 is a relational diagram illustrating relationships between the data signals D2 and D3, a database DB of component values, and the decision subsystem 42 according to some embodiments of the present disclosure. FIG. 14 and FIG. 15 are relational charts of the second data signal D2 and a threshold level THR according to some embodiments of the present disclosure. With reference to FIG. 13, the determination process performed by the decision subsystem 42 compares the second data signal D2 to the database DB of component values of the semiconductor manufacturing equipment 2, and the third data signal D3 is generated according to whether the threshold level THR is reached in the comparison between the second data signal D2 and the database DB of component values. In some embodiments, the database DB of component values may include component values related to vibration, pressure, humidity, electric field, magnetic field, gases, odor, temperature, operating time, or other pertinent component values regarding the condition of the semiconductor manufacturing equipment 2. As shown in FIG. 14, in this example, the second data signal D2 represented on the x-axis does not reach the threshold level THR. On the other hand, in the example of FIG. 15, the second data signal D2 represented on the x-axis reaches and surpasses the threshold level THR. Accordingly, the third data signal D3 is generated according to whether the threshold level THR is reached in the comparison between the second data signal D2 and the database DB of component values.

In some embodiments, when the feedback signal FB is indicative of a malfunction, the semiconductor manufacturing equipment 2 is shut down. Since the feedback signal FB is transmitted back to the semiconductor manufacturing equipment 2, the shutdown may occur automatically when such malfunction is detected by the analysis unit 105, thereby saving products from becoming defective due to malfunctioning vacuum pumps of the semiconductor manufacturing equipment 2, for example. On the other hand, when the feedback signal FB is indicative of a normal equipment status, the semiconductor manufacturing equipment 2 may be allowed to continue operation without an interruption.

Figure 16:
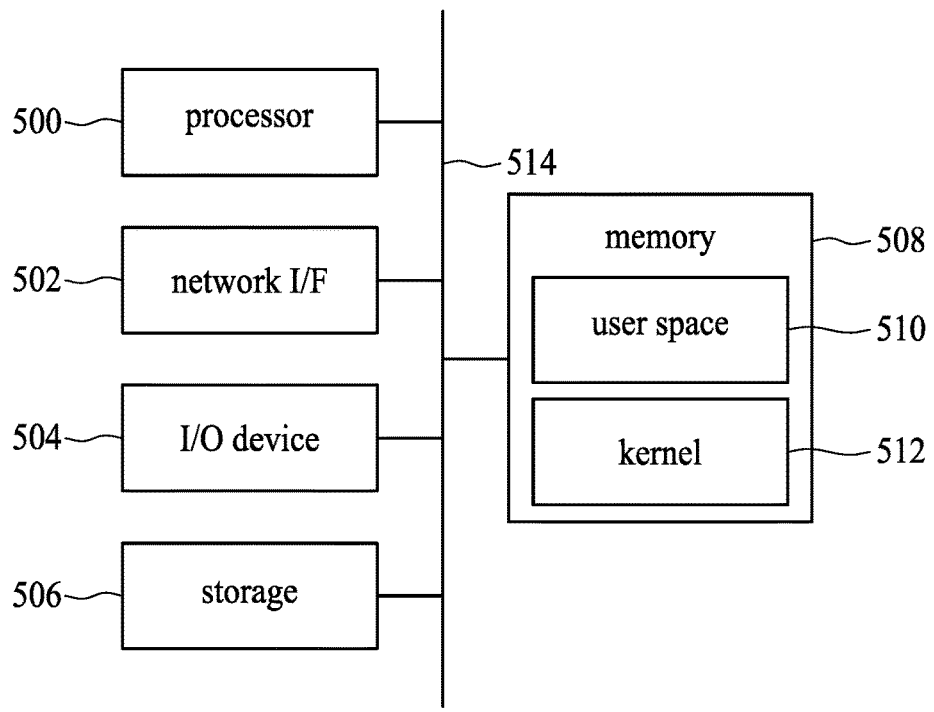
FIG. 16 is a block diagram of a computer system according to some embodiments of the present disclosure.

It should be noted that one or more of the tools, subsystems, methods, or operations described in the present disclosure may be realized by a computer system including instructions operable when executed by one or more processors of the computer system. For example, the analysis unit 105 and a method 600 described later in the present disclosure may be implemented by a computer system depicted in FIG. 16. FIG. 16 is a block diagram of a computer system 50 according to some embodiments of the present disclosure. With reference to FIG. 16, the computer system 50 may include one or more processors 500, a network interface (I/F) 502, a storage device 506, a memory 508, and an input/output (I/O) device 504 communicatively coupled via a bus 514 or other interconnection communication mechanism. The memory 508 includes, in some embodiments, a random access memory (RAM), other dynamic storage device, read-only memory (ROM), or other static storage device, coupled to the bus 514 for storing data or instructions to be executed by the one or more processors 500, and the memory 508 may include a kernel 512, a user space 510, portions of the kernel or the user space, and components thereof. The memory 508 is also used, in some embodiments, for storing temporary variables or other intermediate information during execution of instructions to be executed by the one or more processors 500.

In some embodiments, the storage device 506 is coupled to the bus 514 for transferring data or instructions to, for example, the kernel 512, user space 510, etc. In some embodiments, the operations and functionalities are realized as functions of a program stored in the storage device 506, which may include one or more computer-readable non-transitory storage media coupled to the one or more processors 500. Examples of the computer-readable non-transitory storage media include, but are not limited to, external/removable or internal/built-in storage or memory units, e.g., one or more of an optical disk, such as a DVD, a magnetic disk, such as a hard disk, a semiconductor memory, such as a ROM, a RAM, a memory card, and the like. In some embodiments, the computer-readable non-transitory storage media of the storage device 506 includes instructions operable when executed by the one or more processors 500 to cause the system 100 to receive the at least one input signal IN and perform a first data process to generate a first data signal D1; receive the first data signal D1 and perform a health status monitoring process to generate a second data signal D2; and perform a determination process to generate a third data signal D3 according to the second data signal D2, wherein a feedback signal FB is generated according to the third data signal D3, and the feedback signal FB is transmitted to the semiconductor manufacturing equipment 2. In some embodiments, the one or more computer-readable non-transitory storage media further include instructions operable when executed by the one or more processors 500 to cause the system 100 to generate an alert signal AM according to the third data signal D3. In some embodiments, the alert signal AM is sent to a user of the semiconductor manufacturing equipment 2, and the alert signal AM includes a malfunction diagnosis alert, an equipment lifetime prediction alert, and a leakage/odor alert. In some embodiments, the determination process compares the second data signal D2 to a database of component values of the semiconductor manufacturing equipment 2, and the third data signal D3 is generated according to whether a threshold level is reached in the comparison between the second data signal D2 and the database of component values. In some embodiments, when the feedback signal FB is indicative of a malfunction, the semiconductor manufacturing equipment 2 is shut down. In some embodiments, when the feedback signal FB is indicative of a normal equipment status, the semiconductor manufacturing equipment may be allowed to continue operation without an interruption.

In some embodiments, the I/O device 604 includes an input device, an output device, or a combined input/output device for enabling user interaction with the analysis unit 105. The input device includes, for example, a keyboard, keypad, mouse, trackball, trackpad, or cursor direction keys for communicating information and commands to the processor 500. The output device includes, for example, a display, a printer, a voice synthesizer, etc. for communicating information to a user. In some embodiments, one or more operations or functionalities of the tools, subsystems, and methods described in the present disclosure are realized by the one or more processors 500 of the computer system 50, which is programmed for performing such operations and functionalities. One or more of the memory 508, the network I/F 502, the storage device 506, the I/O device 504, and the bus 514 are operable to receive instructions, data, design rules, netlists, layouts, models and other parameters for processing by the processor 500. In some embodiments, one or more of the operations and functionalities of the tools, subsystems, and methods described in the present disclosure may be implemented by specifically-configured hardware (e.g., by one or more application specific integrated circuits (ASICs)) separate from or in lieu of the processor 500. Some embodiments incorporate more than one of the described operations or functionality in a single ASIC.

Figure 17:
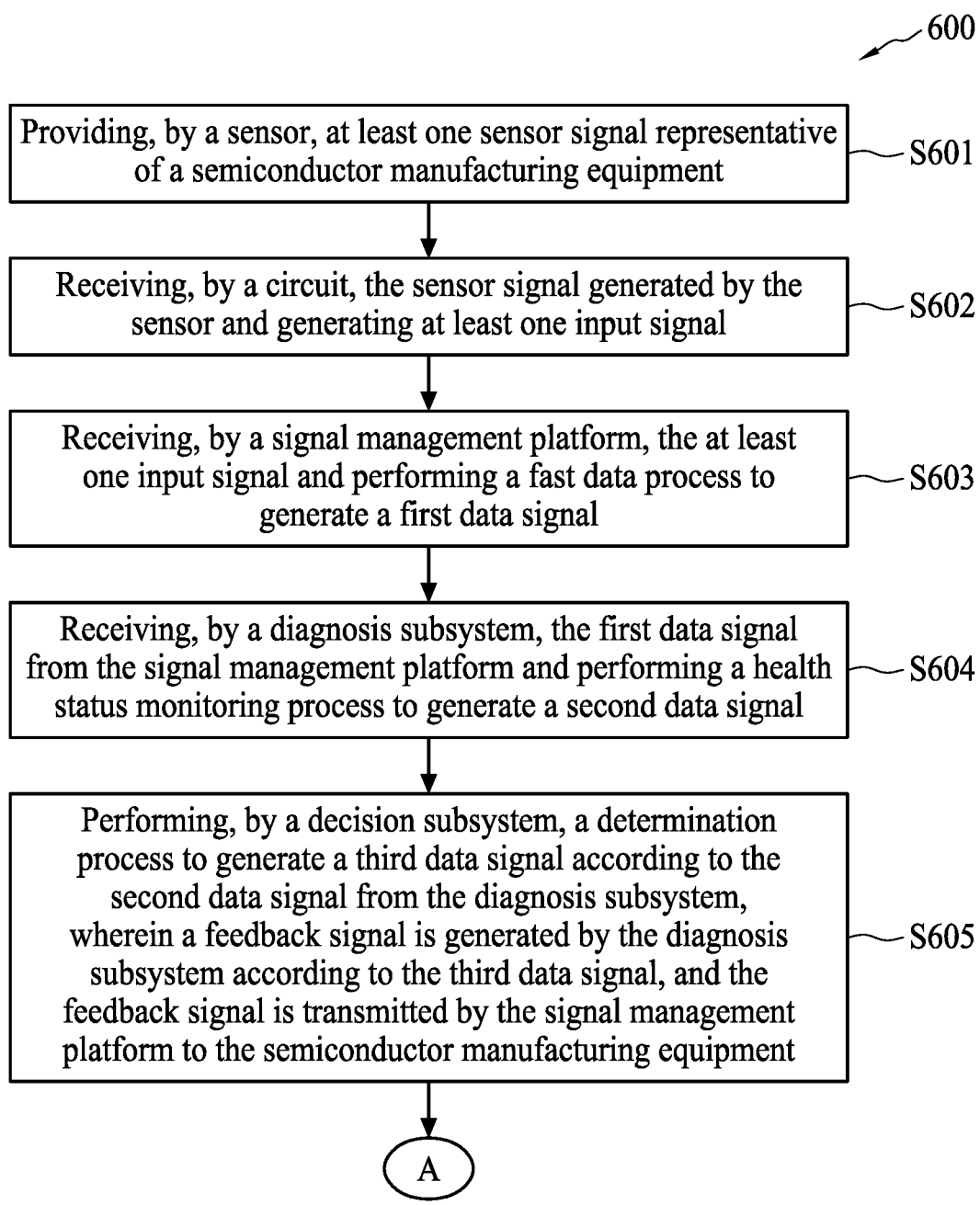
FIG. 17 is a flow diagram of a method for monitoring a semiconductor manufacturing equipment according to some embodiments of the present disclosure.

FIG. 17 is a flow diagram of a method 600 for monitoring the semiconductor manufacturing equipment 2 according to some embodiments of the present disclosure. In some embodiments, the method 600 may be implemented by the system 100 depicted in FIG. 2 to FIG. 8, which may also be realized by the computer system 50 depicted in FIG. 16. With reference to FIG. 17, the method 600 for monitoring the semiconductor manufacturing equipment 2 includes: providing, by the sensor 101, at least one sensor signal SS representative of the semiconductor manufacturing equipment 2 (Step S601); receiving, by the circuit 102, the at least one sensor signal SS generated by the sensor 101 and generating at least one input signal IN (Step S602); receiving, by the signal management platform 40, the at least one input signal IN and performing the first data process to generate the first data signal D1 (Step S603); receiving, by the diagnosis subsystem 41, the first data signal D1 from the signal management platform 40 and performing the health status monitoring process to generate the second data signal D2 (Step S604); and performing, by the decision subsystem 42, the determination process to generate the third data signal D3 according to the second data signal D2 from the diagnosis subsystem 41, wherein the feedback signal FB is generated by the diagnosis subsystem 41 according to the third data signal D3, and the feedback signal FB is transmitted by the signal management platform 40 to the semiconductor manufacturing equipment 2 (Step S605).

Figure 18:
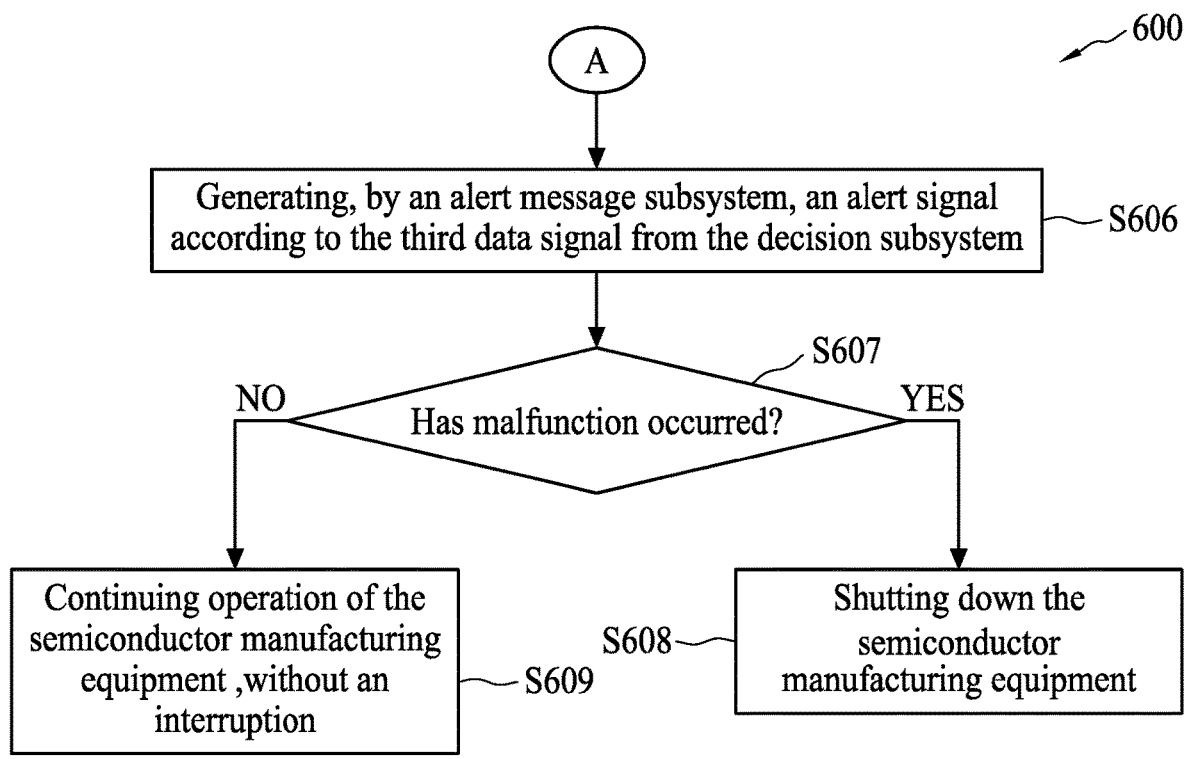
FIG. 18 is a flow diagram of a method for monitoring a semiconductor manufacturing equipment according to some embodiments of the present disclosure.

FIG. 18 is a flow diagram of the method 600 for monitoring the semiconductor manufacturing equipment 2 according to some embodiments of the present disclosure. The flow diagram of FIG. 18 depicts the method 600 after a node A shown in the flow diagram of FIG. 17. With reference to FIG. 18, in some embodiments, the method 600 further includes generating, by the alert message subsystem 43, the alert signal AM according to the third data signal D3 from the decision subsystem 42 (Step S606). In some embodiments, the method 600 further includes determining whether a malfunction has occurred according to the feedback signal (Step S607). When the feedback signal FB is indicative of a malfunction, the semiconductor manufacturing equipment 2 is shut down (Step S608), and when the feedback signal FB is indicative of a normal equipment status, the semiconductor manufacturing equipment 2 continues to operate without an interruption (Step S609).

Figure 19:
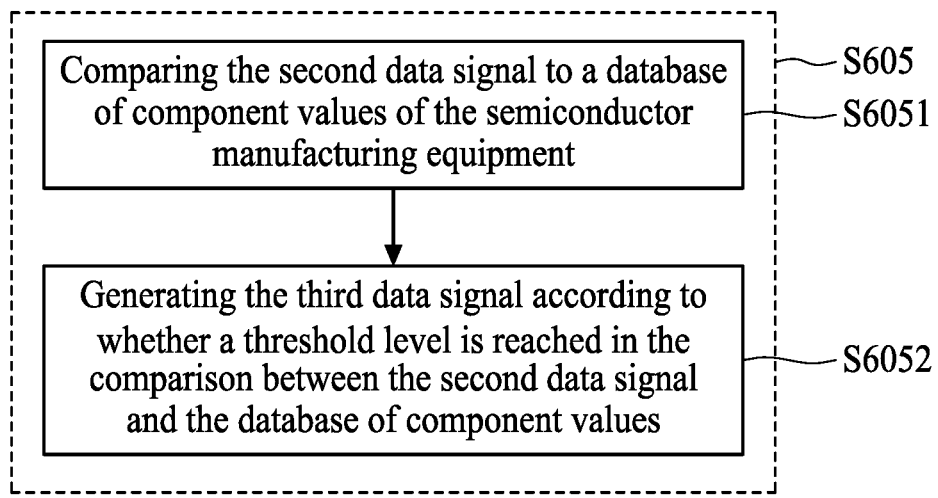
FIG. 19 is a flow diagram of a step of a method for monitoring a semiconductor manufacturing equipment according to some embodiments of the present disclosure.
Figure 20:
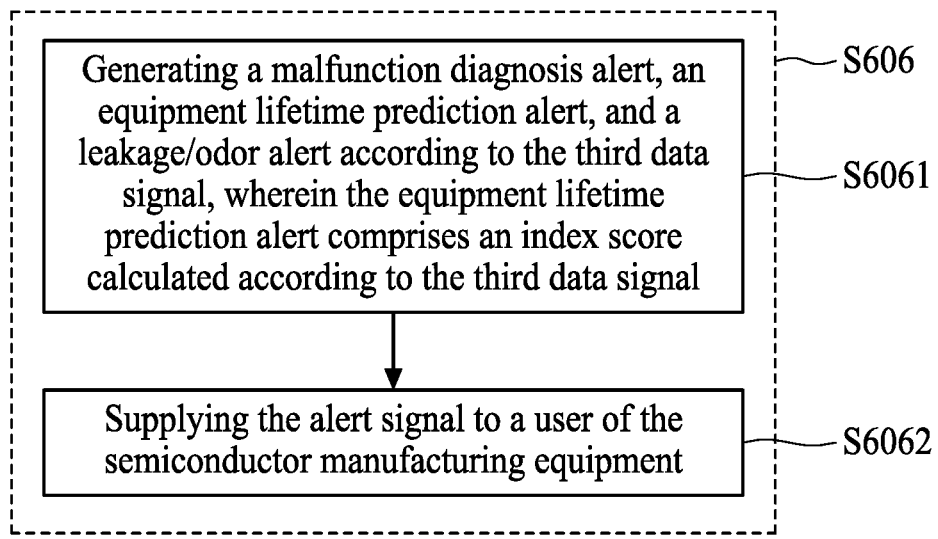
FIG. 20 is a flow diagram of a step of a method for monitoring a semiconductor manufacturing equipment according to some embodiments of the present disclosure.

FIG. 19 is a flow diagram of the Step S605 of performing the determination process to generate the third data signal D3 according to some embodiments of the disclosure. With reference to FIG. 19, in the Step S605, the determination process performed by the decision subsystem 42 compares the second data signal D2 to the database DB of component values of the semiconductor manufacturing equipment 2 (Step S6051), and the third data signal D3 is generated according to whether the threshold level THR is reached in the comparison between the second data signal D2 and the database DB of component values (Step S6052). FIG. 20 is a flow diagram of the Step 5606 of generating the alert signal AM according to some embodiments of the disclosure. With reference to FIG. 20, in the Step 5606, the malfunction diagnosis alert MDA, the equipment lifetime prediction alert ELPA, and the leakage/odor alert LOA are generated by the alert message subsystem 43 according to the third data signal D3, wherein the equipment lifetime prediction alert ELPA includes the index score IDX calculated according to the third data signal D3 (Step S6061). The alert signal AM is sent to the user 108 of the semiconductor manufacturing equipment 2 (Step S6062). In some embodiments, the semiconductor manufacturing equipment 2 includes one or more vacuum pumps.

Accordingly, the system 100 and the method 600 for monitoring the semiconductor manufacturing equipment 2 provide advance indicators capable of predicting the overall condition of equipment such as vacuum pumps. Due to the analysis unit 105, which includes an intelligent signal management platform 40 and an alert message subsystem 43, operators of the semiconductor manufacturing equipment 2 can monitor the status of the equipment and receive advance warnings before equipment malfunctions. Moreover, an appropriate amount of maintenance can be provided due to the data provided by the system 100 and the method 600, thereby saving precious maintenance resources, preventing health hazards, and minimizing defective products.

One aspect of the present disclosure provides a system for monitoring a semiconductor manufacturing equipment, wherein the system includes a sensor, a circuit, and an analysis unit. The sensor provides at least one sensor signal representative of the semiconductor manufacturing equipment. The circuit receives the at least one sensor signal and generates at least one input signal. The analysis unit includes a signal management platform, receiving the at least one input signal and performing a first data process to generate a first data signal; a diagnosis subsystem, receiving the first data signal from the signal management platform, wherein the diagnosis subsystem performs a health status monitoring process to generate a second data signal; and a decision subsystem, performing a determination process to generate a third data signal according to the second data signal from the diagnosis subsystem, wherein the diagnosis subsystem generates a feedback signal according to the third data signal, and the signal management platform transmits the feedback signal to the semiconductor manufacturing equipment.

Another aspect of the present disclosure provides a system for monitoring a semiconductor manufacturing equipment, wherein the system includes a sensor, a circuit, one or more processors, and one or more computer-readable non-transitory storage media. The sensor provides at least one sensor signal representative of the semiconductor manufacturing equipment. The circuit receives the at least one sensor signal and generates at least one input signal. The one or more computer-readable non-transitory storage media are coupled to the one or more processors and include instructions operable when executed by the one or more processors to cause the system to: receive the at least one input signal and perform a first data process to generate a first data signal; receive the first data signal and perform a health status monitoring process to generate a second data signal; and perform a determination process to generate a third data signal according to the second data signal, wherein a feedback signal is generated according to the third data signal, and the feedback signal is transmitted to the semiconductor manufacturing equipment.

Another aspect of the present disclosure provides a method for monitoring a semiconductor manufacturing equipment including: providing, by a sensor, at least one sensor signal representative of the semiconductor manufacturing equipment; receiving, by a circuit, the at least one sensor signal generated by the sensor and generating at least one input signal; receiving, by a signal management platform, the at least one input signal and performing a first data process to generate a first data signal; receiving, by a diagnosis subsystem, the first data signal from the signal management platform and performing a health status monitoring process to generate a second data signal; and performing, by a decision subsystem, a determination process to generate a third data signal according to the second data signal from the diagnosis subsystem, wherein a feedback signal is generated by the diagnosis subsystem according to the third data signal, and the feedback signal is transmitted by the signal management platform to the semiconductor manufacturing equipment.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A system for monitoring a semiconductor manufacturing equipment comprising:
   a sensor providing at least one sensor signal representative of the semiconductor manufacturing equipment;
   a circuit receiving the at least one sensor signal and generating at least one input signal; and
   an analysis unit comprising:
   a signal management platform receiving the at least one input signal and performing a first data process to generate a first data signal;
   a diagnosis subsystem receiving the first data signal from the signal management platform, wherein the diagnosis subsystem performs a health status monitoring process to generate a second data signal; and
   a decision subsystem performing a determination process to generate a third data signal according to the second data signal from the diagnosis subsystem,
   wherein the diagnosis subsystem generates a feedback signal according to the third data signal, and the signal management platform transmits the feedback signal to the semiconductor manufacturing equipment.

2. The system of claim 1, the analysis unit further comprising:
   an alert message subsystem generating an alert signal according to the third data signal from the decision subsystem.

3. The system of claim 2, wherein the alert signal comprises a malfunction diagnosis alert, an equipment lifetime prediction alert, and a leakage/odor alert generated according to the third data signal, wherein the equipment lifetime prediction alert comprises an index score calculated according to the third data signal, and the alert signal is sent to a user of the semiconductor manufacturing equipment.

4. The system of claim 1, wherein the determination process performed by the decision subsystem compares the second data signal to a database of component values of the semiconductor manufacturing equipment, and the third data signal is generated according to whether a threshold level is reached in the comparison between the second data signal and the database of component values.

5. The system of claim 1, wherein when the feedback signal is indicative of a malfunction, the semiconductor manufacturing equipment is shut down.

6. The system of claim 1, wherein when the feedback signal is indicative of a normal equipment status, the semiconductor manufacturing equipment continues to operate without an interruption.

7. The system of claim 1, wherein the semiconductor manufacturing equipment comprises one or more vacuum pumps.

8. A method for monitoring a semiconductor manufacturing equipment, wherein the method comprises:
   providing, by a sensor, at least one sensor signal representative of the semiconductor manufacturing equipment;
   receiving, by a circuit, the at least one sensor signal generated by the sensor and generating at least one input signal;
   receiving, by a signal management platform, the at least one input signal and performing a first data process to generate a first data signal;
   receiving, by a diagnosis subsystem, the first data signal from the signal management platform and performing a health status monitoring process to generate a second data signal; and
   performing, by a decision subsystem, a determination process to generate a third data signal according to the second data signal from the diagnosis subsystem,
   wherein a feedback signal is generated by the diagnosis subsystem according to the third data signal, and the feedback signal is transmitted by the signal management platform to the semiconductor manufacturing equipment.

9. The method of claim 8, further comprising:
   generating, by an alert message subsystem, an alert signal according to the third data signal from the decision subsystem.

10. The method of claim 9, wherein the step of generating the alert signal comprises:
    generating a malfunction diagnosis alert, an equipment lifetime prediction alert, and a leakage/odor alert according to the third data signal, wherein the equipment lifetime prediction alert comprises an index score calculated according to the third data signal; and
    sending the alert signal to a user of the semiconductor manufacturing equipment.

11. The method of claim 8, wherein the step of performing the determination process to generate the third data signal comprises:
    comparing the second data signal to a database of component values of the semiconductor manufacturing equipment; and
    generating the third data signal according to whether a threshold level is reached in the comparison between the second data signal and the database of component values.

12. The method of claim 8, wherein when the feedback signal is indicative of a malfunction, the semiconductor manufacturing equipment is shut down, and when the feedback signal is indicative of a normal equipment status, the semiconductor manufacturing equipment continues to operate without an interruption.

13. The method of claim 8, wherein the semiconductor manufacturing equipment comprises one or more vacuum pumps.

* * * * *